US012725769B2

(12) United States Patent
Nagaike et al.

(10) Patent No.: US 12,725,769 B2
(45) Date of Patent: Sep. 1, 2026

(54) SUBSTRATE PROCESSING SYSTEM AND PARTICLE REMOVAL METHOD

(71) Applicant: Tokyo Electron Limited, Tokyo (JP)

(72) Inventors: Hiroshi Nagaike, Miyagi (JP); Naoki Sato, Miyagi (JP); Masato Obara, Miyagi (JP); Hideyuki Osada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 350 days.

(21) Appl. No.: 18/103,609

(22) Filed: Jan. 31, 2023

(65) Prior Publication Data

US 2023/0245871 A1 Aug. 3, 2023

(30) Foreign Application Priority Data

Jan. 31, 2022 (JP) ................................ 2022-013716

(51) Int. Cl.
*H01J 37/32* (2006.01)
*B08B 6/00* (2006.01)
(Continued)

(52) U.S. Cl.
CPC .......... *H01J 37/32871* (2013.01); *B08B 6/00* (2013.01); *B08B 13/00* (2013.01);
(Continued)

(58) Field of Classification Search
CPC ........... H01J 37/32871; H01J 37/32816; H01J 2237/022; H01J 2237/184; B08B 6/00;
(Continued)

(56) References Cited

U.S. PATENT DOCUMENTS 5,410,122 A * 4/1995 Su ..................... H01J 37/32431
204/298.34
5,584,938 A * 12/1996 Douglas .................... B08B 6/00
15/151
(Continued)

FOREIGN PATENT DOCUMENTS

JP 2000-150443 A 5/2000
JP 2003-051523 A 2/2003
(Continued)

OTHER PUBLICATIONS

TW 202106404 (Year: 2021).*
(Continued)

*Primary Examiner* — Alexander Markoff
(74) *Attorney, Agent, or Firm* — XSENSUS LLP

(57) ABSTRACT

A substrate processing system includes a vacuum transfer module, a substrate processing module, an atmospheric transfer module, a load-lock module, at least one substrate transfer robot disposed in the vacuum transfer module and the atmospheric transfer module, and having at least one end effector, and a controller configured to control a particle removal operation. The particle removal operation includes transferring said at least one end effector in any one of the vacuum transfer module, the substrate processing module, the load-lock module, and the atmospheric transfer module in a state where at least one charging member that is charged is placed on said at least one end effector.

15 Claims, 15 Drawing Sheets

(51) Int. Cl.
*B08B 13/00* (2006.01)
*B25J 15/06* (2006.01)
*H01L 21/67* (2006.01)
*H01L 21/687* (2006.01)
*H10P 72/00* (2026.01)
*H10P 72/76* (2026.01)

(52) U.S. Cl.
CPC ..... *B25J 15/0616* (2013.01); *H01J 37/32816* (2013.01); *H10P 72/0454* (2026.01); *H10P 72/7602* (2026.01); *H01J 2237/022* (2013.01); *H01J 2237/184* (2013.01)

(58) Field of Classification Search
CPC .................. B08B 13/00; B25J 15/0616; H01L 21/67167; H01L 21/68707; H01L 21/67028; H01L 21/67196; H01L 21/67201; H01L 21/67742; H01L 21/67017; H01L 21/67766; H10P 72/0454; H10P 72/7602; H10P 72/0406; H10P 72/0464; H10P 72/0466; H10P 72/3302; H10P 72/0402; H10P 72/3402
See application file for complete search history.

(56) References Cited

U.S. PATENT DOCUMENTS 5,858,108 A * 1/1999 Hwang ............. H01L 21/67028 134/1
6,177,356 B1 * 1/2001 Zinman ............. H01L 21/02043 257/E21.224
6,240,931 B1 * 6/2001 Fujii ......................... B08B 6/00 134/1
6,244,811 B1 * 6/2001 Kroeker ............ H01L 21/67766 414/217
6,526,997 B1 * 3/2003 Henley ..................... B08B 6/00 257/E21.252
7,047,984 B2 * 5/2006 Blattner .................... G03F 1/82 15/345
8,337,629 B2 * 12/2012 Moriya ............. H01J 37/32862 134/1
11,798,818 B2 * 10/2023 Yonekawa ........ H01L 21/67011
2003/0129045 A1 * 7/2003 Bonora ............. H01L 21/67709 414/217
2004/0016443 A1 * 1/2004 Sasaki ....................... B08B 6/00 15/1.51
2004/0079385 A1 * 4/2004 Frisa ......................... B08B 7/00 134/1
2006/0162660 A1 * 7/2006 Shimizu ............. G05B 19/4067 156/345.31
2006/0174835 A1 * 8/2006 Saito .................. C23C 16/4401 118/723 R
2007/0246957 A1 * 10/2007 Liu ................... H01L 21/68707 294/213
2008/0257383 A1 * 10/2008 Levinson .......... H01L 21/67011 134/6
2009/0022901 A1 * 1/2009 Ray .................... H01L 21/6833 427/458
2009/0028672 A1 * 1/2009 Yamawaku ......... H10P 72/3402 414/217
2011/0108056 A1 * 5/2011 Ishizawa ................... B08B 6/00 134/1
2012/0145183 A1 * 6/2012 Ikari ................... H10P 72/0406 134/1
2012/0211029 A1 * 8/2012 Pandit ....................... B08B 5/00 134/21
2012/0247502 A1 * 10/2012 Moriya ..................... B08B 3/12 134/1
2020/0176275 A1 * 6/2020 Yonekawa ........ H01L 21/67011
2020/0384509 A1 * 12/2020 Azaria ...................... B08B 6/00
2021/0259087 A1 * 8/2021 Ramachandran ......... H05F 3/06
2021/0280447 A1 * 9/2021 Amikura .............. B65G 47/902
2022/0199435 A1 * 6/2022 Nanasaki .......... H01L 21/67167
2023/0245871 A1 * 8/2023 Nagaike ............ H01L 21/67201 134/1

FOREIGN PATENT DOCUMENTS

JP 2010-103443 A 5/2010
JP 2014-127640 A 7/2014
TW 200952067 A 12/2009
TW 201732928 A 9/2017

OTHER PUBLICATIONS

KR 10-2017-0058070 (Year: 2017).*
KR 2013-0140393 (Year: 2013).*
KR 10-2008-0084338 (Year: 2008).*

* cited by examiner

FIG. 10A

WITHOUT PARTICLE CHARGING MECHANISM

| PARTICLE COLLECTION EFFICIENCY | | |
|---|---|---|
| 30nm | 100nm | 200nm |
| 56% | 17% | 7% |

FIG. 10B

WITH PARTICLE CHARGING MECHANISM

| PARTICLE COLLECTION EFFICIENCY | | |
|---|---|---|
| 30nm | 100nm | 200nm |
| 89% | 90% | 72% |

SUBSTRATE PROCESSING SYSTEM AND PARTICLE REMOVAL METHOD

CROSS-REFERENCE TO RELATED APPLICATIONS

This application claims priority to Japanese Patent Application No. 2022-013716 filed on Jan. 31, 2022, the entire contents of which are incorporated herein by reference.

TECHNICAL FIELD

The present disclosure relates to a substrate processing system and a particle removal method.

BACKGROUND

Patent Document 1 discloses a technique for collecting particles by evacuating a chamber while cooling a protective member disposed to cover an upper surface of a stage in the chamber using a cooling attraction portion, such as a Peltier element or the like, disposed in the protective member.

PRIOR ART DOCUMENTS

Patent Documents

Patent Document 1: Japanese Laid-open Patent Publication No. 2010-103443

SUMMARY

The present disclosure provides a technique for effectively removing particles.

One aspect of the present disclosure provides a substrate processing system comprising: a vacuum transfer module; a substrate processing module connected to the vacuum transfer module and configured to process a substrate under a depressurized environment; an atmospheric transfer module; a load-lock module having an inner space that is switchable between a depressurized environment and an atmospheric pressure environment, and connected to the vacuum transfer module and the atmospheric transfer module; at least one substrate transfer robot disposed in the vacuum transfer module and the atmospheric transfer module, and having at least one end effector; and a controller configured to control a particle removal operation, wherein the particle removal operation includes: transferring said at least one end effector in any one of the vacuum transfer module, the substrate processing module, the load-lock module, and the atmospheric transfer module in a state where at least one charging member that is charged is placed on said at least one end effector.

BRIEF DESCRIPTION OF THE DRAWINGS

The objects and features of the present disclosure will become apparent from the following description of embodiments, given in conjunction with the accompanying drawings, in which:

FIGS. 10A and 10B show examples of particle removal results; and

DETAILED DESCRIPTION

Hereinafter, embodiments of a substrate processing system and a particle removal method of the present disclosure will be described in detail with reference to the accompanying drawings. The substrate processing system and the particle removal method of the present disclosure are not limited by the following embodiments.

When a substrate processing system operates in a state where the inside thereof is opened to the atmosphere during startup or maintenance, particles may be generated due to intrusion of foreign substances. For example, when a substrate processing system operates in a state where the inside thereof is opened to the atmosphere, moisture in the atmosphere is adhered to an inner wall and remains, so that hydrates that are secondary products are generated, which may result in generation of particles. In addition, when the substrate processing system is used for a long period of time, particles may be generated due to the influence of generated deposits, an attached gas, or the like.

Conventionally, in a substrate processing system, a method of repeatedly transferring dummy silicon wafers (hereinafter, also referred to as "dummy wafers") into the substrate processing system and removing particles adhered to the dummy wafers has been performed. The conventional method can provide a certain cleaning effect, but the particle removal efficiency is low because free-falling particles just happen to fall on the dummy wafers.

Therefore, a technique for effectively removing particles is expected.

Embodiment

Substrate Processing System 1

Figure 1:
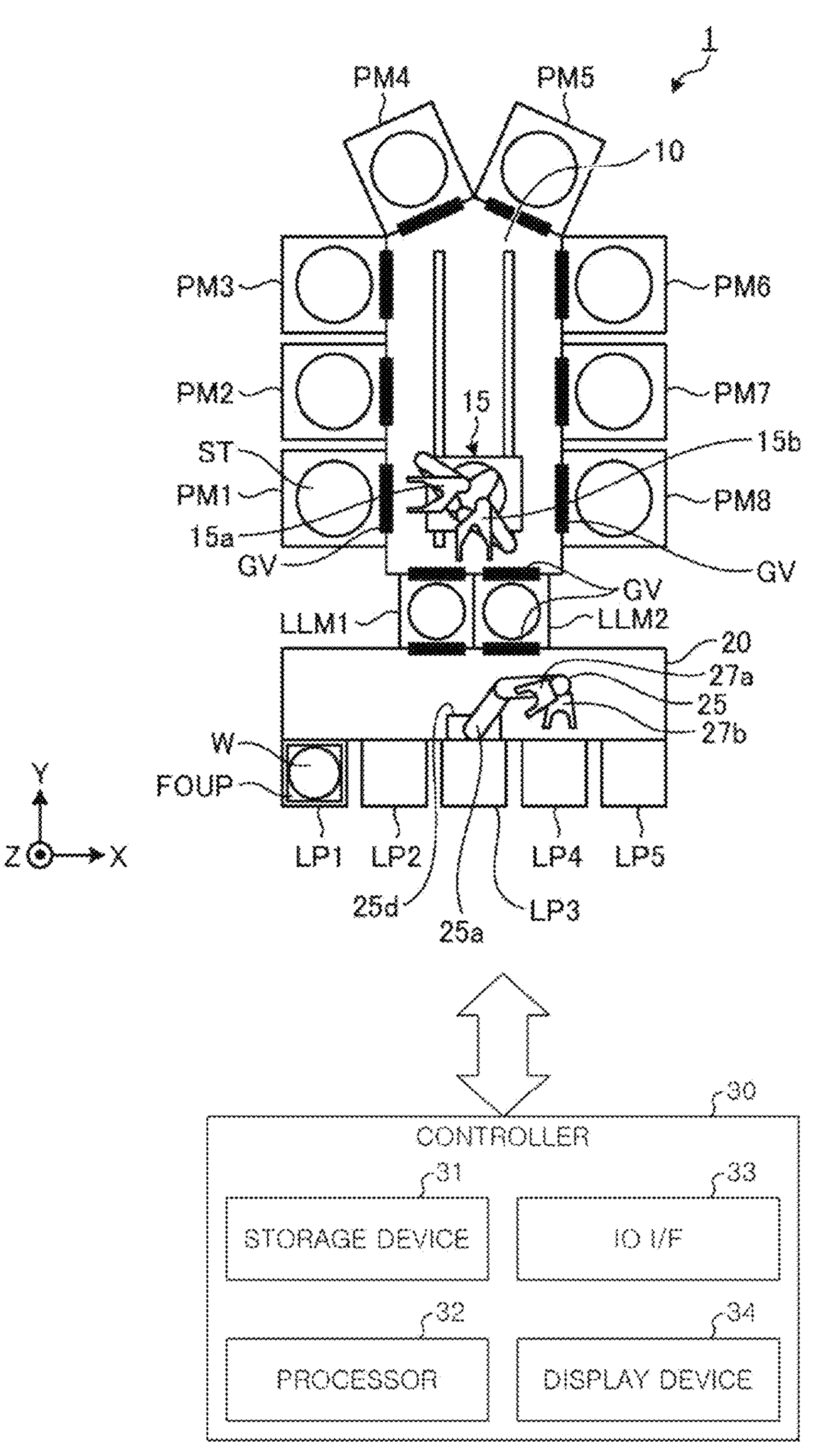
FIG. 1 shows an example of a schematic configuration of a substrate processing system according to an embodiment.

Next, an embodiment will be described. FIG. 1 shows an example of a schematic configuration of a substrate processing system 1 according to an embodiment. The substrate processing system 1 includes a plurality of vacuum processing chambers (hereinafter, also referred to as "process modules") PM1 to PM8, a vacuum transfer chamber 10, and a normal pressure transfer chamber 20. The substrate processing system 1 further includes a plurality of load-lock modules LLM1 and LLM2, a plurality of load ports LP1 to LP5, and a controller 30.

In the example of FIG. 1, eight process modules PM1 to PM8, two load-lock modules LLM1 to LLM2, and five load ports LP1 to LP5 are illustrated. However, the number of the process modules PM, the number of the load-lock modules LLM, and the number of the load ports LP of the substrate processing system 1 are not limited to those in FIG. 1. Hereinafter, the eight process modules PM1 to PM8 will be collectively referred to as "process modules PM" unless otherwise stated. Similarly, the two load-lock modules LLM1 and LLM2 are collectively referred to as "load-lock modules LLM." Similarly, the five load ports LP1 to LP5 are collectively referred to as "load ports LP." The substrate processing system 1 of the present embodiment includes at least two load-lock modules LLM.

The process modules PM are airtightly configured, and can be exhausted to a depressurized state by an exhaust mechanism. The process module PM performs substrate processing such as etching, film formation, or the like on the substrate W in a predetermined depressurized atmosphere suitable for substrate processing. The substrate W is, for example, a semiconductor wafer. Each process module PM has therein a stage ST for supporting the substrate W. The process modules PM are maintained in a depressurized atmosphere during substrate processing. Each process modules PM is connected to the vacuum transfer chamber 10 via openable/closable gate valves GV.

The vacuum transfer chamber 10 is airtightly configured and can be exhausted to a depressurized state by the exhaust mechanism. The vacuum transfer chamber 10 transfers the substrate W in a predetermined depressurized atmosphere. For example, the vacuum transfer chamber 10 has therein a first transfer mechanism 15 for transferring the substrate W. The first transfer mechanism 15 has an extensible/contractible robot arm. At least one first transfer mechanism 15 is disposed in the vacuum transfer chamber 10 and has at least one end effector. The first transfer mechanism 15 according to the embodiment has a first arm 15*a* and a second arm 15*b* that can operate individually. Each of the first arm 15*a* and the second arm 15*b* has a substantially U-shaped pick at the tip thereof, and is configured to hold the substrate W. The first transfer mechanism 15 extends and contracts the robot arm to transfer the substrate W between the process modules PM1 to PM8 and the load-lock modules LLM1 and LLM2. The substrate W processed in a certain process module PM can be transferred to another process module PM for performing subsequent processing via the vacuum transfer chamber 10. The substrate W that has been subjected to all processing is transferred to the load-lock module LLM via the vacuum transfer chamber 10.

Each of the load-lock modules LLM is airtightly configured, and can be switched between an atmospheric atmosphere and a depressurized atmosphere by the exhaust mechanism. The load-lock modules LLM are arranged side by side along one side of the vacuum transfer chamber 10 where the process modules PM are not disposed. The load-lock modules LLM and the vacuum transfer chamber 10 can communicate through the gate valves GV. The load-lock modules LLM, at a side opposite to the side connected to the vacuum transfer chamber 10, are connected to the normal pressure transfer chamber 20. The load-lock modules LLM and the normal pressure transfer chamber 20 can communicate with each other through the gate valves GV.

The normal pressure transfer chamber 20 is maintained in a normal pressure atmosphere. The load-lock modules LLM are arranged side by side on one side of the normal pressure transfer chamber 20. Further, the load ports LP are arranged side by side on the other side of the normal pressure transfer chamber 20. The normal pressure transfer chamber 20 has therein a second transfer mechanism 25 for transferring an object to be transferred between the load-lock modules LLM and the load ports LP. The second transfer mechanism 25 has an arm 25*a*. The arm 25*a* is rotatably fixed on a base 25*d*. The base 25*d* is fixed near a load port LP3. The substantially U-shaped first pick 27*a* and second pick 27*b* are rotatably connected to the tip of the arm 25*a*. In the present embodiment, the first transfer mechanism 15 and the second transfer mechanism 25 correspond to the substrate transfer robot of the present disclosure. Further, the pick of the first arm 15*a*, the pick of the second arm 15*b*, the first pick 27*a*, and the second pick 27*b* correspond to the end effector of the present disclosure.

The load port LP is configured such that a storage container (hereinafter, also referred to as "front opening unified pod (FOUP)") accommodating the substrate W can be placed thereon. The FOUP is the storage container that can accommodate the substrate W. The FOUP has a lid (not shown) that can be opened and closed. When the FOUP is placed on the load port LP, the lid of the FOUP and a door of the load port LP are engaged. If the door of the load port LP is opened in that state, the lid of the FOUP moves together with the door of the load port LP. Accordingly, the FOUP is opened, and the FOUP and the normal pressure transfer chamber 20 communicate with each other through the load port LP.

The process modules PM, the vacuum transfer chamber 10, the first transfer mechanism 15, the load-lock modules LLM, the normal pressure transfer chamber 20, the second transfer mechanism 25, and the load ports LP configured as described above are connected to and controlled by the controller 30.

The controller 30 is an information processing device such as a computer or the like. The controller 30 controls individual components of the substrate processing system 1. Specific configuration and function of the controller 30 are not particularly limited. The controller 30 includes, e.g., a storage device 31, a processor 32, an input/output interface (IO I/F) 33, and a display device 34. The storage device 31 is, e.g., any storage device such as a hard disk, an optical disk, a semiconductor memory device, or the like. The processor 32 is, e.g., a processor such as a central processing unit (CPU), a micro processing unit (MPU), or the like. The display device 34 is a functional device for displaying information, such as a liquid crystal screen, a touch panel, or the like. The processor 32 reads out and executes a program or a recipe stored in the storage device 31 to control the individual components of the substrate processing system 1 through the input/output interface 33.

In the substrate processing system 1, when the process modules PM, the vacuum transfer chamber 10, and the like are opened to the atmosphere for startup or maintenance, particles may be generated due to intrusion of foreign substances. In addition, when the substrate processing system 1 is used for a long period of time, particles may be generated due to the influence of generated deposits, an attached gas, or the like.

Conventionally, in a substrate processing system, a method of repeatedly transferring dummy wafers into the substrate processing system and removing particles adhered to the dummy wafers has been performed. However, in the conventional method, the efficiency of removing particles is low because free-falling particles just happen to fall on the dummy wafers. For example, particles in the vacuum transfer chamber 10, the load-lock modules LLM, and the normal pressure transfer chamber 20 tend to fall from the upper part and the inner wall unlike particles in the process modules PM. These particles are accumulated for a long time on the lower part, the surface of the first transfer mechanism 15, the surface of the second transfer mechanism 25, or the like, and may lead to secondary or tertiary contamination of the surface of the substrate W.

Particles normally have positive or negative charges, even if they are not actively charged.

Therefore, in the present embodiment, at least one charging member that is charged is transferred into the substrate processing system 1, and stays or moves therein so that particles can be adhered to the surface of the charging member by an electrostatic force and collected. By unloading the charging member to which particles are adhered to the outside, the cleanliness of the inside of the substrate processing system 1 is improved.

The charging member may have any configuration as long as it can be charged. The charging member preferably has a shape similar to that of the substrate W. Since the charging member has the same shape as that of the substrate W, the charging member can be transferred in the same manner as the substrate W by the transfer system for transferring the substrate W, such as the first transfer mechanism 15 or the second transfer mechanism 25. For example, the charging member may be a semiconductor wafer such as a silicon wafer having an insulating film formed on a surface thereof, or a semiconductor wafer having a dedicated dielectric film formed on a surface thereof. The charging member can realize a cleaning function by charging the charging member by applying a voltage to the surface thereof or by other methods. Hereinafter, a case where the charging member has the same shape as that of the substrate W will be described.

Figure 2A:
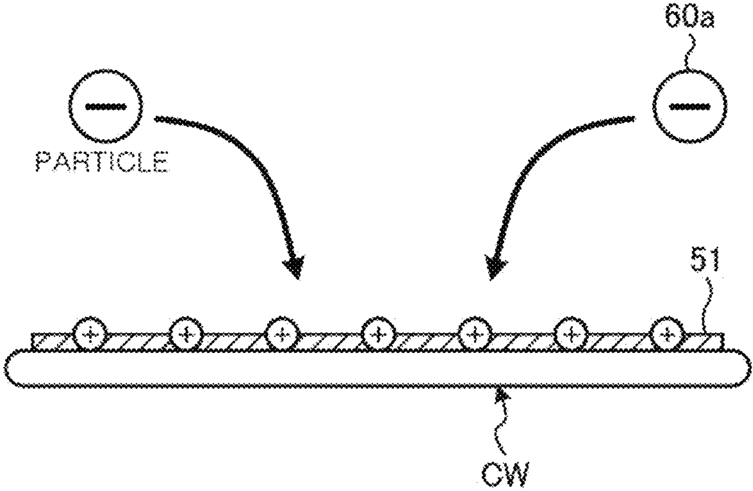
FIGS. 2A and 2B show examples of a charging member according to an embodiment.
Figure 2B:
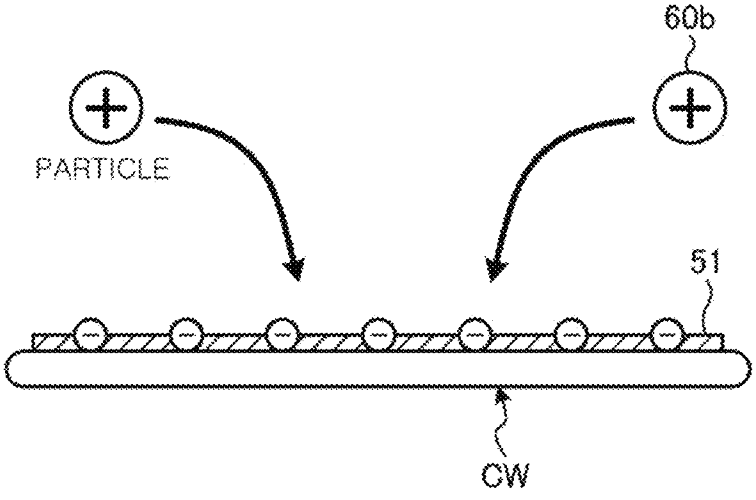

FIGS. 2A and 2B show an example of the charging member according to the embodiment. FIGS. 2A and 2B show a case where the charging member is a cleaning semiconductor wafer CW (hereinafter, referred to as "cleaning wafer") having an insulating film 51 formed on an upper surface thereof. As shown in FIG. 2A, the cleaning wafer CW can electrically attract negative particles 60*a* by positively charging the upper surface thereof. Further, as shown in FIG. 2B, the cleaning wafer CW can electrically attract positive particles 60*b* by negatively charging the upper surface thereof. Although the case where the insulating film 51 is formed on the top surface (upper surface) of the cleaning wafer CW has been described as an example, the present disclosure is not limited thereto. The insulating film 51 may be formed on the bottom surface (lower surface). The insulating film 51 may be formed on the top surface and the bottom surface. The insulating film 51 may be formed on the top surface, the bottom surface, and the side surface. The charging member may have any configuration as long as the surface thereof can be charged.

Figure 3A:
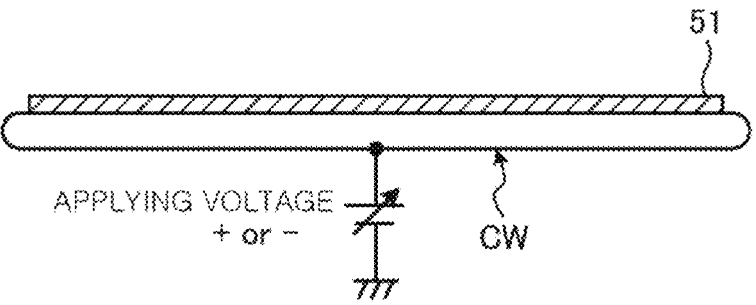
FIGS. 3A to 3F show examples of a method for charging a charging member according to an embodiment.
Figure 3B:
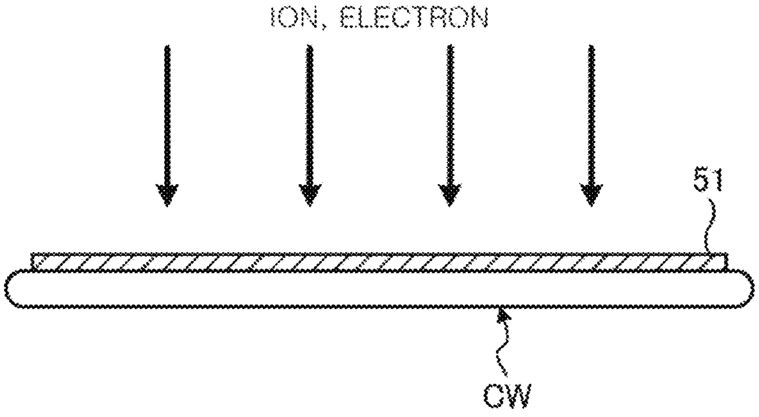
Figure 3C:
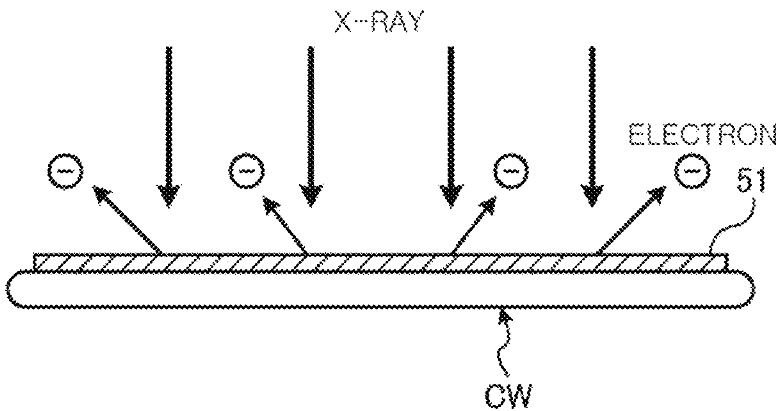
Figure 3D:
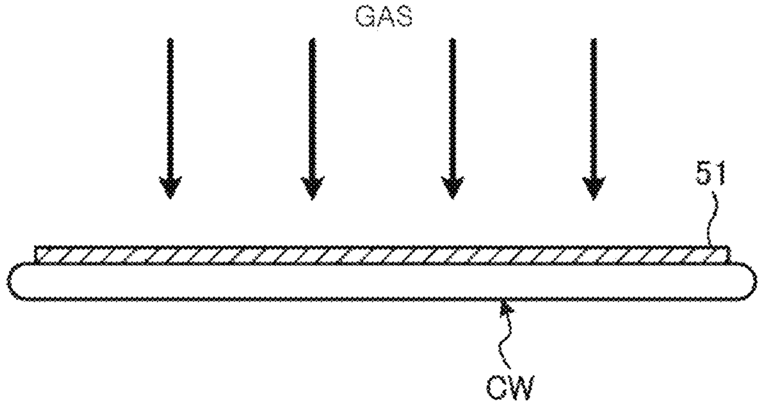
Figure 3E:
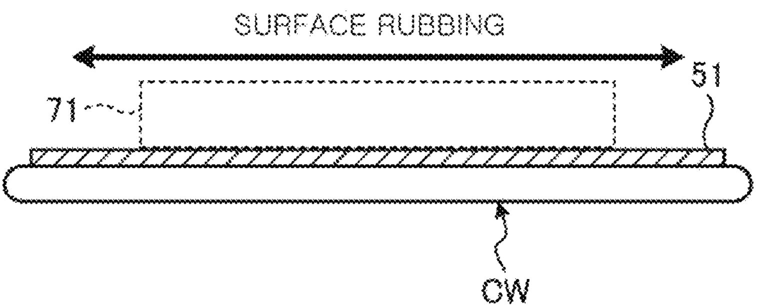
Figure 3F:
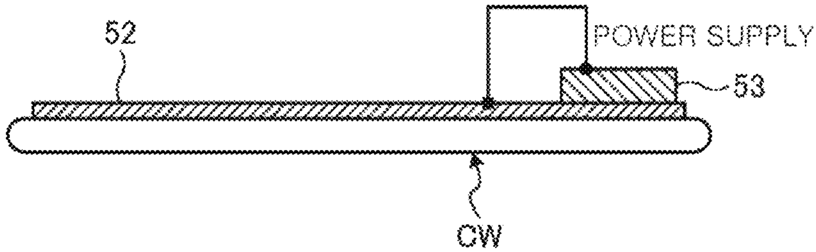

FIGS. 3A to 3F show examples of a method for charging a charging member according to an embodiment. FIGS. 3A to 3F show methods for charging a cleaning wafer CW as a charging member. In FIG. 3A, the surface of the cleaning wafer CW is charged by applying a positive or negative voltage to the cleaning wafer CW. In FIG. 3B, the surface of the cleaning wafer CW is charged by irradiating ions or electrons to the cleaning wafer CW. In FIG. 3C, the surface of the cleaning wafer CW is charged by irradiating X-rays to the cleaning wafer CW. In FIG. 3D, the surface of the cleaning wafer CW is charged by friction with gas injected to the cleaning wafer CW. In FIG. 3E, the surface of the cleaning wafer CW is charged by rubbing it with an object 71. In FIG. 3F, a conductive film 52 is formed on the surface of the cleaning wafer CW, and a power supply 53 is provided. In FIG. 3F, the cleaning wafer CW is charged by applying a voltage from the power supply 53 to the conductive film 52. Further, in FIG. 3F, the cleaning wafer CW may be charged by supplying a power from the transfer system such as the first transfer mechanism 15 or the second transfer mechanism 25.

The cleaning wafer CW may be charged outside the substrate processing system 1. For example, the cleaning wafer CW charged outside the substrate processing system 1 is stored in a FOUP and set in the load port LP. The substrate processing system 1 takes out the charged cleaning wafer CW from the FOUP, and causes the charged cleaning wafer CW to stay or move in the substrate processing system 1 to collect particles. Then, the substrate processing system 1 returns the cleaning wafer CW to which the collected particles are adhered to the FOUP. In this manner, the inside of the substrate processing system 1 is cleaned.

The cleaning wafer CW may be charged inside the substrate processing system 1. For example, the picks of the first arm 15*a* and the second arm 15*b* of the first transfer mechanism 15 of the substrate processing system 1, or the first pick 27*a* and the second pick 27*b* of the second transfer mechanism 25 may be provided with a power supply part for charging the cleaning wafer CW. For example, a charging mechanism capable of charging the cleaning wafer CW by the charging method shown in FIGS. 3A to 3E may be provided inside the substrate processing system 1.

Figure 4:
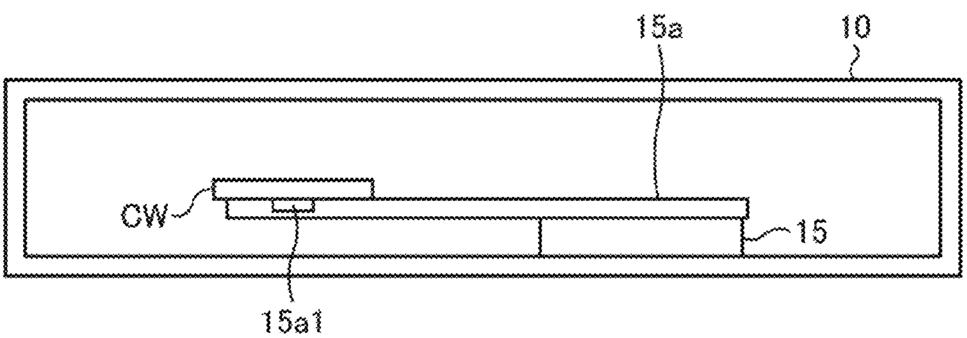
FIG. 4 shows an example of a schematic configuration of the substrate processing system according to the embodiment.

FIG. 4 shows an example of a schematic configuration of the substrate processing system 1 according to the embodiment. FIG. 4 shows a case where the pick of the first arm 15*a* of the first transfer mechanism 15 installed in the vacuum transfer chamber 10 is provided with a power supply part 15*a*1 for charging the cleaning wafer CW. The cleaning wafer CW is provided with a conductive portion such as a terminal or the like at a portion in contact with the power supply part 15*a*1. A power is supplied to the power supply part 15*a*1 through the inner portion of the first arm 15*a*. The power supply part 15*a*1 charges the cleaning wafer CW positively or negatively by applying a positive or negative voltage to the conductive portion of the cleaning wafer CW.

Figure 5:
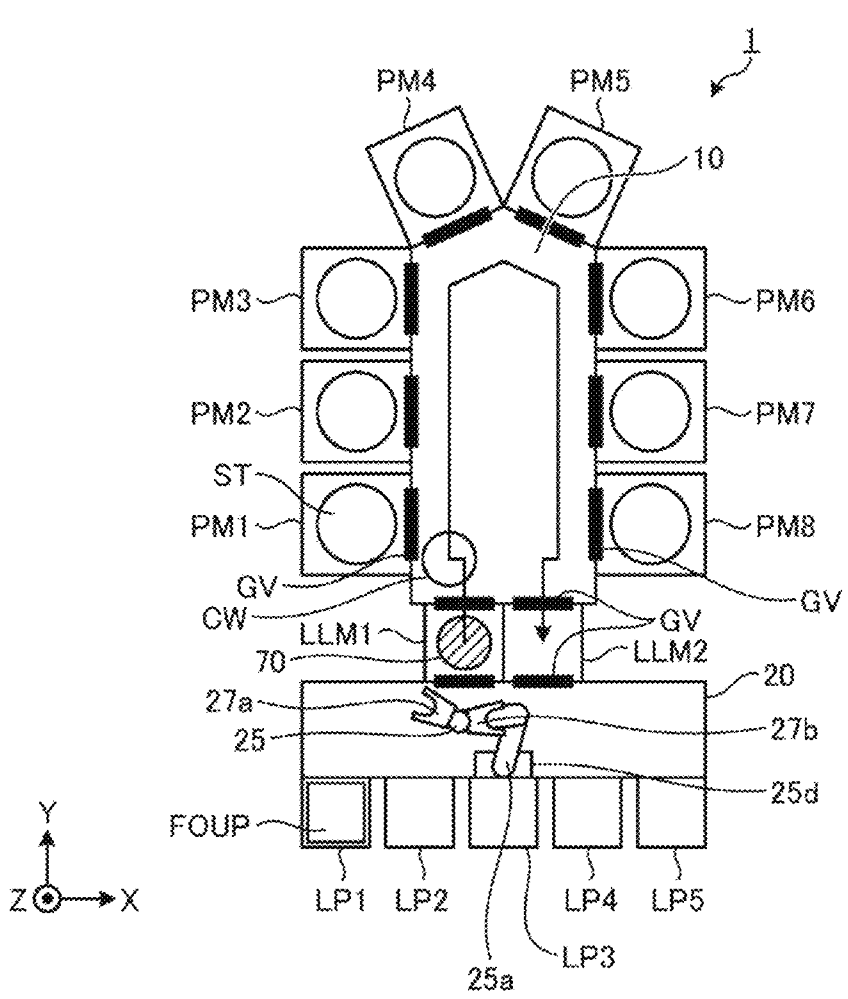
FIG. 5 shows an example of a schematic configuration of the substrate processing system according to the embodiment.

FIG. 5 shows an example of a schematic configuration of the substrate processing system 1 according to the embodiment. FIG. 5 shows a case where a charging mechanism 70 capable of charging the cleaning wafer CW is provided in the load-lock module LLM. The charging mechanism 70 can charge the cleaning wafer CW by any one of the charging methods shown in FIGS. 3A to 3F, for example. The charging mechanism 70 may be provided in the vacuum transfer chamber 10, the normal pressure transfer chamber 20, or the load port LP, or may be provided in the FOUP.

The substrate processing system 1 collects particles by causing the charged cleaning wafer CW to stay or move therein. FIG. 5 shows a case where the charged cleaning wafer CW is moved along the inner surface of the vacuum transfer chamber 10 that is connected to the process modules PM. Accordingly, particles entering from the process modules PM can be collected by the charged cleaning wafer CW. The substrate processing system 1 may collect particles by causing a plurality of charged cleaning wafers CW to stay or move therein. For example, the substrate processing system 1 moves the charged cleaning wafers CW along the inner surface, that is connected to the process modules PM, of the vacuum transfer chamber 10 in a state where the charged cleaning wafers CW are placed on the pick of the first arm 15*a* and the pick of the second arm 15*b*. Accordingly, particles can be quickly collected by the plurality of charged cleaning wafers CW.

Figure 6A:
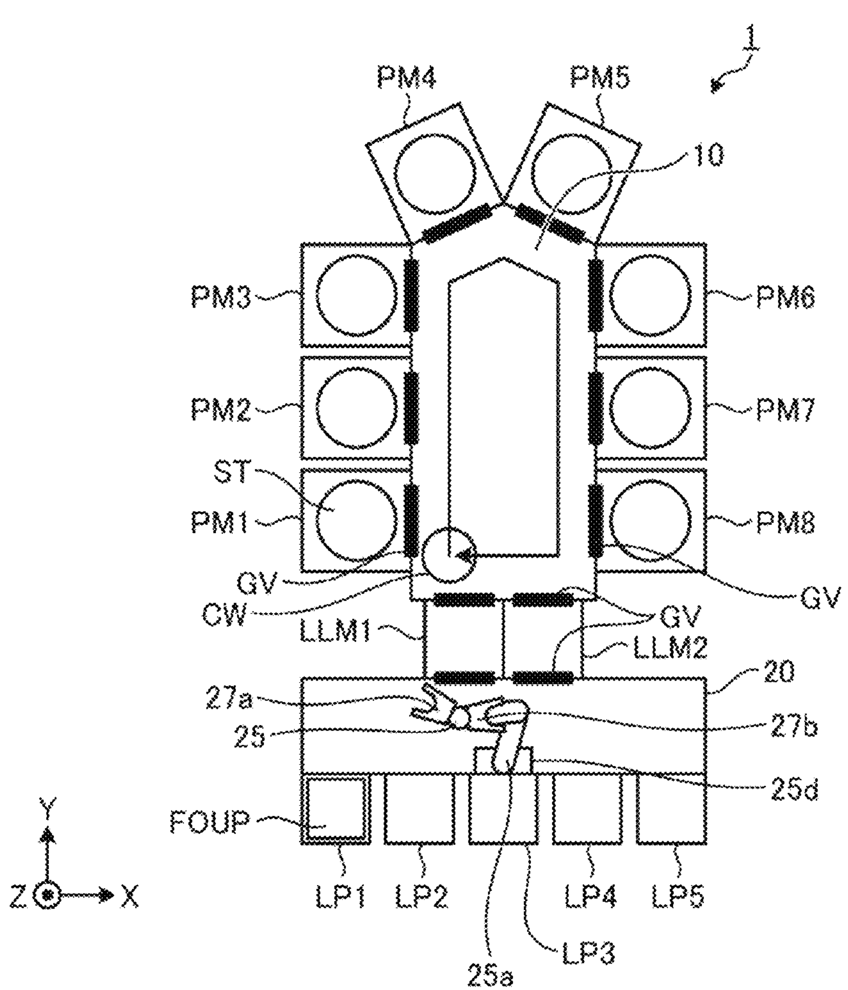
FIGS. 6A and 6B show examples of a moving path of a cleaning wafer according to an embodiment.
Figure 6B:
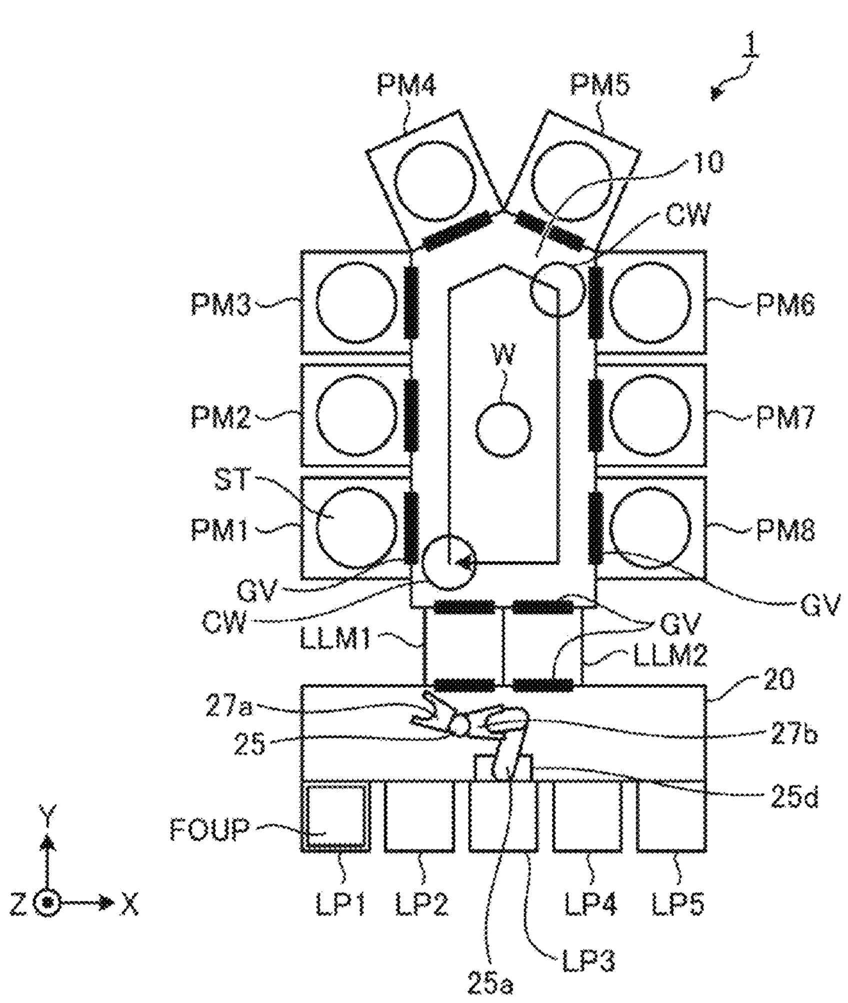

The moving path of the charged cleaning wafer CW may vary, and preferably covers the entire inner space of the substrate processing system 1. Further, the charged cleaning wafer CW may revolve in the inner space of the substrate processing system 1 multiple times. Further, the charged cleaning wafer CW may be moved in the entire inner space of the substrate processing system 1. Further, in the substrate processing system 1, the charged cleaning wafer CW may be moved to follow the substrate W. For example, in the substrate processing system 1, the charged cleaning wafer CW may revolve around the substrate W. FIGS. 6A and 6B show examples of the moving path of the cleaning wafer CW according to the embodiment. FIG. 6A shows a case of revolving the charged cleaning wafer CW multiple times in the vacuum transfer chamber 10. FIG. 6B shows a case of revolving the charged cleaning wafer CW around the substrate W processed by the process modules PM.

The substrate processing system 1 may hold the charged cleaning wafer CW at any one of multiple positions therein for a first period of time. The first period of time is preferably 10 minutes or longer. By stopping the transfer of the cleaning wafer CW and maintaining such a state, surrounding particles can be attracted to the cleaning wafer CW by an electrostatic force. For example, in the case of FIGS. 5 and 6A, the transfer of the cleaning wafer CW may be temporarily stopped near the positions connected to the process modules PM and such a state may be maintained for the first period of time.

The cleaning wafer CW may have a positively charged area and a negatively charged area on the surfaces thereof. Further, the cleaning wafer CW may have a charging area that can be charged positively or negatively on the surface thereof. By forming the insulating film 51 on the side surface or the bottom surface of the cleaning wafer CW and charging the surfaces thereof, it is possible to effectively collect particles floating on the bottom portion or the side portion of the transfer system or particles adhered to the substrate support on which the substrate W is placed, such as the stage ST or the like.

Figure 7A:
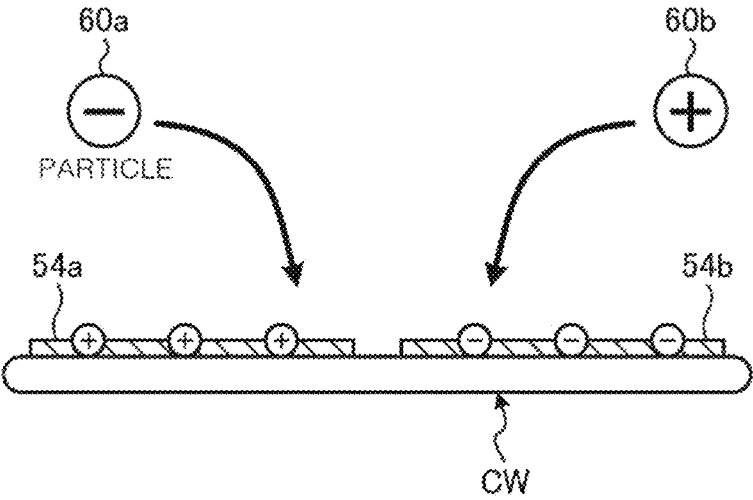
FIGS. 7A and 7B show examples of the charging member according to the embodiment.

FIG. 7A shows an example of a charging member according to an embodiment. FIG. 7A shows a case where a positively charged charging area 54*a* and a negatively charged charging area 54*b* are provided on the upper surface of the cleaning wafer CW. The charging area 54*a* is positively charged, and thus can electrically attract the negative particles 60*a*. The charging area 54*b* is negatively charged, and thus can electrically attract the positive particles 60*b*. The cleaning wafer CW may have a plurality of charging areas 54*a* and 54*b*.

Figure 7B:
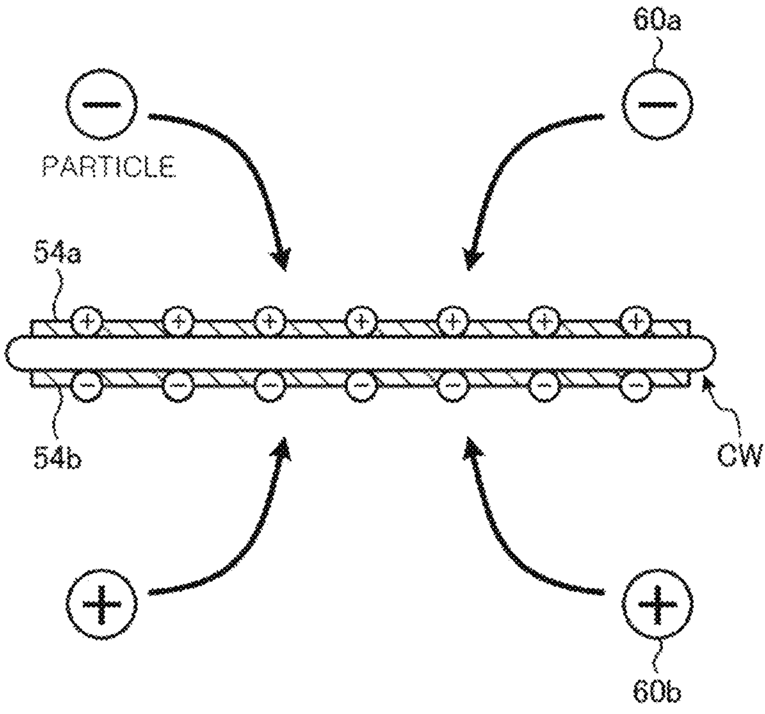

FIG. 7B shows an example of the charging member according to the embodiment. FIG. 7B shows a case where the positively charged charging area 54*a* is disposed on the upper surface of the cleaning wafer CW, and the negatively charged charging area 54*b* is disposed on the bottom surface of the cleaning wafer CW. The cleaning wafer CW shown in FIG. 7B electrically attracts the negative particles 60*a* using the charging area 54*a* disposed on the upper surface thereof, and electrically attracts the positive particles 60*b* using the charging area 54*b* disposed on the bottom surface thereof. The cleaning wafer CW may have the negatively charged charging area 54*b* on the upper surface thereof and the positively charged charging area 54*a* on the bottom surface thereof.

The substrate processing system 1 may collect positive particles and negative particles at the same time by causing the cleaning wafer W having a positively charged area and a negatively charged area on the surfaces thereof to stay or moving in the substrate processing system 1. In addition, the substrate processing system 1 may collect positive particles and negative particles at the same time by causing the cleaning wafer CW having a positively charged area on the surface thereof and the cleaning wafer CW having a negative charged area on the surface thereof to stay or move in the substrate processing system 1. In addition, the substrate processing system 1 may collect positive particles and negative particles individually by causing the cleaning wafer W having a positively charged area on the surface thereof and the cleaning wafer CW having a negatively charged area on the surface thereof to stay or move in the substrate processing system 1 individually.

Particles are charged by irradiation of UV rays or X-rays, or by corona discharge. Therefore, the substrate processing system 1 may positively charge particles therein. For example, the substrate processing system 1 may have therein a particle charging mechanism capable of charging particles by irradiation of UV rays or X-rays or by corona discharge.

Figure 8:
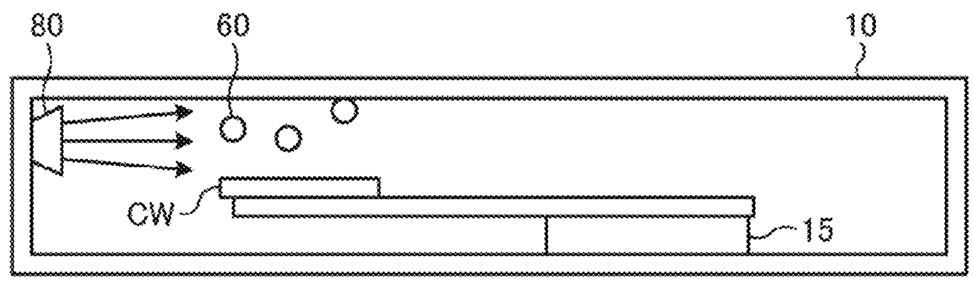
FIG. 8 shows an example of a schematic configuration of the substrate processing system according to the embodiment.

FIG. 8 shows an example of a schematic configuration of the substrate processing system 1 according to the embodiment. FIG. 8 shows a case where an irradiation device 80 for irradiating UV rays is provided, as a particle charging mechanism, in the vacuum transfer chamber 10. The particles 60 are positively or negatively charged by UV rays irradiated from the irradiation device 80. By forcibly charging the particles 60, the electrostatic force that allows the particles 60 to be attracted to the cleaning wafer CW can be increased. Accordingly, a high particle collection effect can be obtained. Further, a wide range can be cleaned in a short period of time. The particle charging mechanism such as the irradiation device 80 or the like may be disposed in the normal pressure transfer chamber 20, each process module PM, and the load port LP.

The cleaning wafer CW can be reused by removing the attracted particles. The attracted particles can be removed from the cleaning wafer CW by exerting a repulsive force between the cleaning wafer W and the particles while alternately applying positive and negative charges, and performing gas blowing and vacuum evacuation. The particles can also be removed from the cleaning wafer CW by heating or generation of high-frequency plasma. The removal of particles from the cleaning wafer CW may be performed outside the substrate processing system 1, or may be performed inside the substrate processing system 1. For example, in the configuration of FIG. 5, the substrate processing system 1 may perform gas blowing and evacuation while positively and negatively charging the cleaning wafer CW alternately using the charging mechanism 70 (particle removal mechanism) in the load-lock module LLM to remove the particles from the cleaning wafer CW.

Particle Removal Method

Figure 9:
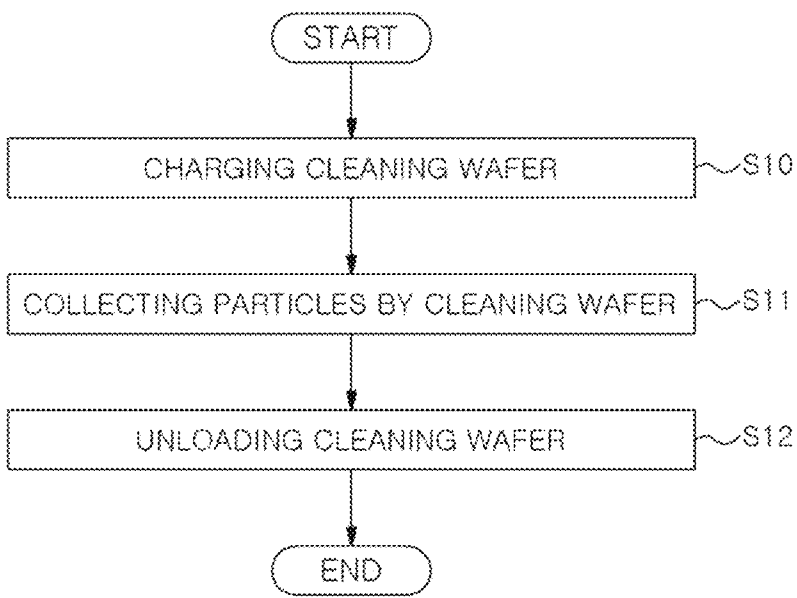
FIG. 9 is a flowchart showing a sequence of a particle removal method according to an embodiment.

FIG. 9 is a flowchart showing a sequence of a particle removal method according to an embodiment. The processing of the particle removal method according to the embodiment is performed when a FOUP storing cleaning wafers CW is set in the load port LP and a predetermined operation for instructing removal of particles is performed by the controller 30, for example.

At least one cleaning wafer CW is charged (step S10). For example, the controller 30 controls the transfer system such as the first transfer mechanism 15 and the second transfer mechanism 25 to take out the cleaning wafer CW from the FOUP and transfer it to the charging mechanism 70. Then, the controller 30 controls the charging mechanism 70 to charge the cleaning wafer CW. When the cleaning wafer CW charged outside the substrate processing system 1 is stored in the FOUP, step S10 may not be executed.

Next, at least one cleaning wafer CW that is charged stays or moves in the substrate processing system 1 to collect particles (step S11). For example, the controller 30 controls the transfer system such as the first transfer mechanism 15 and the second transfer mechanism 25 to transfer the charged cleaning wafer CW to any one of the vacuum transfer chamber 10, the process modules PM, the load-lock modules LLM, and the normal pressure transfer chamber 20. Then, the controller 30 holds the charged cleaning wafer CW at any one of multiple positions therein for the first period of time to collect particles.

Next, the cleaning wafer CW after particle collection is unloaded to the FOUP (step S12), and the processing is ended. For example, the controller 30 controls the transfer system such as the first transfer mechanism 15 and the second transfer mechanism 25 to transfer the cleaning wafer CW after particle collection to the FOUP.

In the particle removal method according to the embodiment, particles can be actively collected using an electrostatic force by transferring the charged cleaning wafer CW into the substrate processing system 1. Accordingly, the particle removal method according to the embodiment can remove particles effectively.

An example of the effect of the particle removal method of the embodiment will be described. FIG. 10A shows an example of particle removal results. FIG. 10A shows the results of evaluating the particle collection efficiency by charging an electrode plate simulating the cleaning wafer CW using test particles of known particle sizes. FIG. 10A shows the collection efficiency of particles with particle sizes of 30 nm, 100 nm and 200 nm. In the evaluation of FIG. 10A, particles were collected without providing the particle charging mechanism such as the irradiation device 80 or the like. Particles usually have positive charges or negative charges, even if they are not actively charged. Therefore, 56% of particles with a diameter of 30 nm can be collected without active charging, and the particle collection function is achieved. Further, as the particle size decreases, the electrostatic force exceeds the influence of the inertial force and the gravity of the particles. Therefore, particles with smaller particle diameters can be effectively collected. Hence, the particle removal method of the embodiment is a cleaning method that is more effective in the future when particles become finer.

FIG. 10B shows another example of the particle removal results. Similarly to FIG. 10A, FIG. 10B shows the results of evaluating the particle collection efficiency by charging an electrode plate simulating the cleaning wafer CW using test particles of known particle sizes. In the evaluation of FIG. 10B, the particles were collected by actively charging the particles using corona discharge. When the active charging was not performed, the collection efficiency of particles with a particle size of 30 nm was 56%, as shown in FIG. 10A. On the other hand, when the particles were charged, as shown in FIG. 10B, the collection efficiency of the particles with a particle size of 30 nm was improved to 89%, and most of the particles near the electrode plate were collected.

From this result, it is presumed that the number of particles in the substrate processing system 1 is greatly reduced by causing the charged cleaning wafer CW to stay or move in the substrate processing system 1.

In the case of charring the cleaning wafer CW by voltage application, the charging amount increases as the applied voltage becomes higher. Therefore, the electrostatic force for the particles increases, and the particle collection efficiency is improved.

Figure 11A:
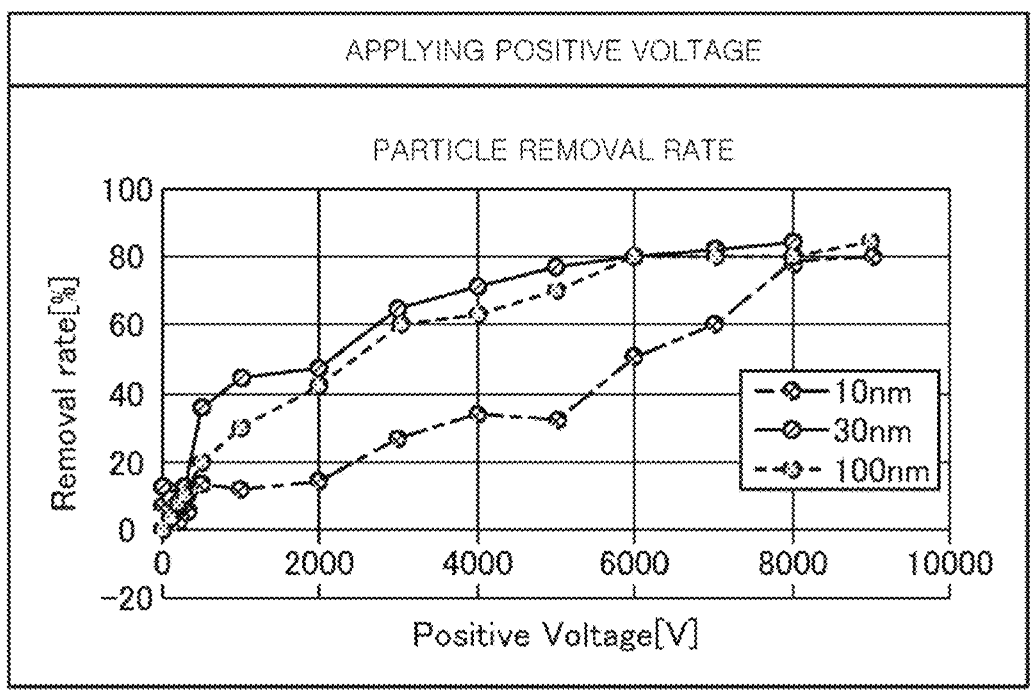
FIGS. 11A and 11B show examples of changes in particle collection efficiency in the case of changing an applied voltage.
Figure 11B:
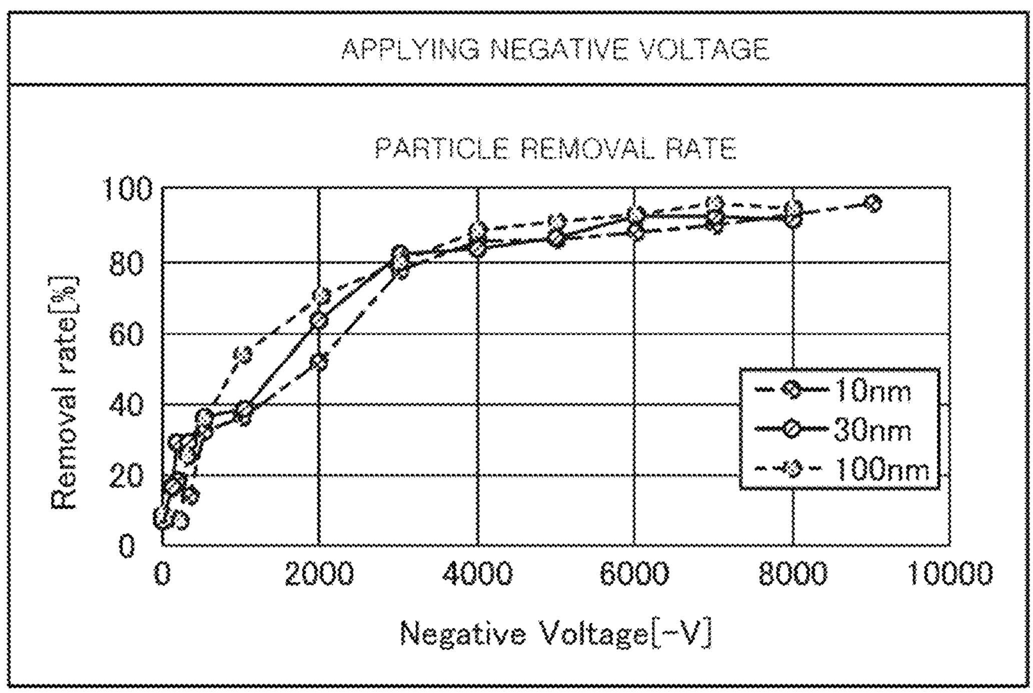

FIGS. 11A and 11B show examples of changes in the particle collection efficiency in the case of changing an applied voltage. FIGS. 11A and 11B show the results of collecting test particles with known particles sizes using an electrode plate charged with an applied voltage in the case of changing the applied voltage for charging the electrode plate simulating the cleaning wafer CW. FIG. 11A shows the case of changing an applied voltage within a positive range. FIG. 11B shows the case of changing an applied voltage within a negative range. As shown in FIGS. 11A and 11B, an applied voltage of 500V or higher is required to collect particles, regardless of whether it is positive or negative, and a high collection efficiency can be obtained at an applied voltage of 2000V or higher. Therefore, the cleaning wafer CW is preferably charged at ±500 V or higher, more preferably ±2000 V or higher.

The substrate processing system 1 may promote separation of particles from the inner wall to enhance the cleaning effect at the time of performing the processing of the particle removal method according to the embodiment. For example, the substrate processing system 1 can promote separation of particles from the inner wall by opening/closing operations of the gate valves GV or by arm operations of the first transfer mechanism 15 and the second transfer mechanism 25 at the time of transferring the cleaning wafer CW. Further, the substrate processing system 1 can promote separation of particles from the inner wall by performing device operations such as inflow and exhaust of gas, and utilizing the force of gas or vibration. Further, in the substrate processing system 1, in the case of promoting the separation of particles, it is more effective to separate particles with a stronger force using a higher speed or a larger gas flow rate instead of a normal substrate processing operation.

The particle removal method according to the embodiment is performed when it is required to remove particles. For example, the particle removal method according to the embodiment is performed when the substrate processing system 1 is manufactured, or during start-up, or during operation after maintenance. For example, the particle removal method according to the embodiment is performed when evacuation is performed after the vacuum transfer chamber 10 is opened to the atmosphere. Further, the particle removal method according to the embodiment is appropriately performed during mass production of the apparatus. For example, the particle removal method according to the embodiment is performed when many particles are detected in particle inspection using a product wafer or a dummy wafer. Accordingly, it is possible to maintain the cleanliness of the inside of the substrate processing system 1, shorten the start-up time, reduce the frequency of maintenance, and improve the yield.

Effect of Embodiment

As described above, the substrate processing system 1 according to the embodiment includes the vacuum transfer chamber 10 (the vacuum transfer module), the process modules PM (the substrate processing modules), the normal pressure transfer chamber 20 (the atmospheric transfer module), the load-lock modules LLM, at least one substrate transfer robot (the first transfer mechanism 15 and the second transfer mechanism 25), and the controller 30 (control part). Each of the process modules PM is connected to the vacuum transfer chamber 10 and configured to process the substrate W under a depressurized environment. Each of the load-lock modules LLM has an inner space that can be switched between a depressurized environment and an atmospheric pressure environment, and is connected to the vacuum transfer chamber 10 and the normal pressure transfer chamber 20 to relay the substrate W between the vacuum transfer chamber 10 and the normal pressure transfer chamber 20. At least one substrate transfer robot is disposed in the vacuum transfer chamber 10 and the normal pressure transfer chamber 20 and has at least one end effector. The controller 30 is configured to control the particle removal operation. The particle removal operation includes transferring at least one end effector into any one of the vacuum transfer chamber 10, the process modules PM, the load-lock modules LLM, and the normal pressure transfer chamber 20 in a state where at least one cleaning wafer CW (charging member) that is charged is placed on at least one end effector. Accordingly, the substrate processing system 1 according to the embodiment can effectively remove particles.

In the particle removal operation, the cleaning wafer CW is transferred in the vacuum transfer chamber 10. Hence, the substrate processing system 1 can effectively remove particles in the vacuum transfer chamber 10.

In the particle removal operation, the charged cleaning wafers CW are moved along the inner surface of the vacuum transfer chamber 10 that is connected to the process modules PM in a state where the cleaning wafers CW are placed on the pick of the first arm 15*a* and the pick of the second arm 15*b* of the first transfer mechanism 15. Accordingly, the substrate processing system 1 according to the embodiment can quickly collect particles using the plurality of charged cleaning wafers CW.

In the particle removal operation, when the charged cleaning wafer CW is moved along the inner surface of the vacuum transfer chamber 10 that is connected to the process modules PM, the transfer of the cleaning wafer CW is temporarily stopped near the positions connected to the process modules PM. Such a state is maintained for the first period of time. The first period of time is 10 minutes or longer. Accordingly, the substrate processing system 1 can sufficiently attract surrounding particles to the cleaning wafer CW using an electrostatic force.

Further, the substrate transfer robot (the first transfer mechanism 15) has at the end effector the power supply 15*a*1 (the power supply part) for charging the cleaning wafer CW. In the particle removal operation, a power is supplied from the power supply 15*a*1 to the cleaning wafer CW placed on the end effector to charge the cleaning wafer CW. The end effector is transferred in any one of the process modules PM, the load-lock modules LLM, and the normal pressure transfer chamber 20. Accordingly, in the substrate processing system 1 according to the embodiment, the cleaning wafer CW can be charged by the substrate transfer robot, and the charged cleaning wafer CW can be transferred to effectively remove particles.

Further, the substrate processing system 1 according to the embodiment further includes the charging mechanism 70 for charging the cleaning wafer CW. In the particle removal operation, the cleaning wafer CW is charged by the charging mechanism 70, and the end effector is transferred in any one of the process modules PM, the load-lock modules LLM, and the normal pressure transfer chamber 20 in a state where the charged cleaning wafer CW is placed on the end effector. Further, the charging mechanism 70 is disposed in any one of the vacuum transfer chamber 10, the load-lock modules, and the normal pressure transfer chamber 20. Accordingly, in the substrate processing system 1 according to the embodiment, the cleaning wafer CW can be charged by the charging mechanism 70, and transferred to effectively remove particles.

The cleaning wafer CW has the charging areas 54*a* and 54*b* that are charged positively and negatively, respectively, on the surfaces thereof. In the particle removal operation, the cleaning wafer CW in which the charged areas 54*a* and 54*b* are positively and negatively charged respectively is transferred. Accordingly, the substrate processing system 1 can collect positive and negative particles at the same time.

Further, the cleaning wafer CW has on the surface thereof the charging area that can be charged positively or negatively. In the particle removal operation, the cleaning wafer CW having a positively charged charging area and the cleaning wafer CW having a negatively charged charging area are individually transferred. Accordingly, the substrate processing system 1 can separately collect positive particles and negative particles using the positively charged cleaning wafer CW and the negatively charged cleaning wafer CW.

Further, the substrate processing system 1 according to the embodiment further includes the particle charging mechanism (the irradiation device 80) for charging particles in any one of the process modules PM, the load-lock modules, and the normal pressure transfer chamber 20. Accordingly, the substrate processing system 1 can improve the particle collection efficiency. Further, the substrate processing system 1 can effectively collect particles having large particle sizes.

Further, the substrate processing system 1 according to the embodiment further includes the particle removal mechanism for removing particles adhered to the cleaning wafer CW. Accordingly, the substrate processing system 1 can reuse the cleaning wafer CW.

While the embodiments of the present disclosure have been described, it should be noted that the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiments, the case where the substrate W is a semiconductor wafer has been described as an example. However, the present disclosure is not limited thereto. The substrate may be any substrate.

In should be noted that the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The invention claimed is:

1. A substrate processing system comprising:

a vacuum transfer module;

a substrate processing module connected to the vacuum transfer module and configured to process a substrate under a depressurized environment;

an atmospheric transfer module;

a load-lock module having an inner space that is switchable between a depressurized environment and an atmospheric pressure environment via an exhaust, and connected to the vacuum transfer module and the atmospheric transfer module;

a first substrate transfer robot disposed in the vacuum transfer module and a second substrate transfer robot disposed in the atmospheric transfer module, each of the first and second substrate transfer robots having an end effector;

a cleaning wafer being charged with a positive or negative voltage, the cleaning wafer including an insulating film;

a charging mechanism configured to charge the cleaning wafer with the positive or the negative voltage; and a controller having a processor and a memory with a computer readable program stored therein, the controller being configured to:

cause the charging mechanism to charge the cleaning wafer with the positive or the negative voltage, and then perform a particle removal operation of causing the first substrate transfer robot to move the charged cleaning wafer along an inner surface of the vacuum transfer module that is connected to the substrate processing module to collect particles entering the vacuum transfer module, by electrical attraction, from the substrate processing module.

2. The substrate processing system of claim 1, wherein the controller is further configured to hold the cleaning wafer for a first period of time near a position connected to the substrate processing module to allow for surrounding particles to be attracted to the cleaning wafer by electrostatic force.

3. The substrate processing system of claim 2, wherein the first period of time is 10 minutes or longer.

4. The substrate processing system of claim 1, wherein each of the first substrate transfer robot and the second substrate transfer robot has, at the end effector, a power supply configured to charge the cleaning wafer, and in the particle removal operation, the cleaning wafer is placed on the end effector and is charged by the power supply.

5. The substrate processing system of claim 1, wherein the charging mechanism is disposed in any one of the vacuum transfer module, the load-lock module, and the atmospheric transfer module.

6. The substrate processing system of claim 1, wherein the cleaning wafer has on surfaces thereof a charging area that is positively charged and a charging area that is negatively charged, and the insulating film is disposed on an upper surface of the cleaning wafer.

7. The substrate processing system of claim 1, wherein the charging mechanism is disposed in any one of the substrate processing module, the load-lock module, the atmospheric transfer module, and the vacuum transfer module.

8. The substrate processing system of claim 7, wherein the charging mechanism charges particles in the vacuum transfer module.

9. The substrate processing system of claim 1, further comprising gate valves between the vacuum transfer module and the substrate processing module, wherein the controller is configured to promote separation of particles by opening and closing the gate valves.

10. The substrate processing system of claim 1, wherein the controller is configured to promote separation of particles by gas inflow and exhaust in the vacuum transfer module.

11. The substrate processing system of claim 1, wherein the particle removal operation is performed during startup or shutdown of the substrate processing system.

12. The substrate processing system of claim 1, wherein the particle removal operation is performed when evacuation is performed after the vacuum transfer module is opened to the atmosphere.

13. The substrate processing system of claim 1, wherein the controller is configured to cause the charging mechanism to charge the cleaning wafer with the positive or the negative voltage of at least 500V.

14. The substrate processing system of claim 1, wherein the controller is configured to cause the charging mechanism to charge the cleaning wafer with the positive or the negative voltage of at least 2000V.

15. The substrate processing system of claim 1, wherein the controller is configured to cause the charging mechanism to charge the cleaning wafer with the positive voltage of at least 6000 V or the negative voltage of at least 2000V.

* * * * *